(12) United States Patent  (10) Patent No.: US 7,737,610 B2
Yoshida et al.  (45) Date of Patent: Jun. 15, 2010

(54) DRIVE APPARATUS HAVING AUXILIARY SPRINGS

(75) Inventors: Ryuichi Yoshida, Sakai (JP); Shuichi Fujii, Matsubara (JP); Hirohisa Sueyoshi, Sakai (JP)

(73) Assignee: Konica Minolta Opto, Inc., Tokyo (JP)

( * ) Notice: Subject to any disclaimer, the term of this patent is extended or adjusted under 35 U.S.C. 154(b) by 0 days.

(21) Appl. No.: 12/224,744

(22) PCT Filed: Feb. 13, 2007

(86) PCT No.: PCT/JP2007/052482

§ 371 (c)(1),
(2), (4) Date: Sep. 4, 2008

(87) PCT Pub. No.: WO2007/105396

PCT Pub. Date: Sep. 20, 2007

(65) Prior Publication Data

US 2009/0026886 A1 Jan. 29, 2009

(30) Foreign Application Priority Data

Mar. 8, 2006 (JP) .............................. 2006-062171

(51) Int. Cl.
H01L 41/08 (2006.01)
(52) U.S. Cl. .................... 310/355; 310/323.01; 310/328
(58) Field of Classification Search .................. 310/323, 310/328
See application file for complete search history.

(56) References Cited

U.S. PATENT DOCUMENTS 6,114,799 A    9/2000  Yoshida et al.
6,384,493 B1 * 5/2002  Okamoto .................. 310/12.27

FOREIGN PATENT DOCUMENTS

| JP | 10-084649 | 3/1998 |
| JP | 10-225150 | 8/1998 |
| JP | 2000-278972 | 10/2000 |
| JP | 2004-080964 | 3/2004 |
| WO | WO 2007/105396 A1 | 9/2007 |

OTHER PUBLICATIONS

International Search Report in International Application No. PCT/JP2007/052482, dated May 8, 2008, 1 page.

* cited by examiner

*Primary Examiner*—J. SanMartin
(74) *Attorney, Agent, or Firm*—Brinks Hofer Gilson & Lione

(57) ABSTRACT

Provided is a self-propelled drive apparatus that enables stable drive and low cost, the apparatus includes: a movable member which has an electromechanical transducer whose one end is fixed to the movable member and the other end is fixed to a drive friction member, which is movably supported by the movable member movably in the first direction, which represents a extension-contraction direction A-B of the electromechanical transducer, where the movable member is supported movably in the first direction; a pair of plate springs which extend in a belt shape in the first direction and sandwich the drive friction member; a base member holding the plate springs in a cantilever manner in the direction of the short sides of the plate springs; and auxiliary springs disposed on the outside of the plate springs to apply elastic force only to both ends of each of the plate springs.

3 Claims, 4 Drawing Sheets

DRIVE APPARATUS HAVING AUXILIARY SPRINGS

This application is a National Stage of International Application PCT/JP2007/052482filed with Japanese Patent Office on Feb. 13, 2007.

TECHNICAL FIELD

The present invention relates to a drive apparatus, particular to a self-propelled type drive apparatus using an electromechanical transducer.

BACKGROUND ART

One of the apparatuses known in the conventional art is a drive apparatus that positions a movable member by sliding movement, of a drive friction member, by an electromechanical transducer such as a piezoelectric element. The drive apparatus is available in two types—an impact type drive apparatus wherein the piezoelectric element does not move as described in the Patent Document 1, and a self-propelled type drive apparatus wherein the piezoelectric element is held by a movable member and moves together with the movable member as described in the Patent Document 2.

As disclosed in the Patent Document 2, the conventional self-propelled type drive apparatus uses a fixed guide member along which the drive friction member slides, and a biased guide member that is biased to press the drive friction member against the fixed guide member.

However, in the conventional drive apparatus, the frictional force between the drive friction member and fixed guide member is kept constant only when there is a complete agreement between the movable direction of a driven member such as a stage which is driven by the movable member and the direction wherein the fixed guide member is installed.

The fixed guide member and biased guide member are required to be made of a highly rigid material of stable frictional force. This requirement has been a cause for increased costs.

Patent Document 1: Japanese Unexamined Patent Application Publication No. 2004-80964

Patent Document 2: Japanese Unexamined Patent Application Publication No. H10-225150

DISCLOSURE OF INVENTION

Object of Invention

In view of the aforementioned problems, an object of the present invention is to provide a less expensive self-propelled type drive apparatus capable of stable drive.

Means for Solving the Problems

In order to solve the aforementioned problems, a drive apparatus of the present invention, comprising:

a movable member, on which an electromechanical transducer is secured at a first end thereof, and which holds a drive friction member movably in an expansion-contraction direction of the electromechanical transducer, the drive friction member being connected to a second end of the electromechanical transducer, and the movable member being supported movably in a expansion-contraction direction of the electromechanical transducer;

a pair of plate springs which is extended in a belt shape in the expansion-contraction direction of the electromechanical transducer, the plate springs sandwiching the drive friction member; and a base member which holds the plate springs in a cantilever manner in a direction of shorter sides of the plate springs.

According to this structure, a drive friction member is sandwiched and held between a pair of plate springs. This arrangement ensures that, even if the drive friction member is slightly deviated in position in the normal direction of the plate springs, a stable frictional force is maintained without any fluctuation in the force of the plate springs holding the drive friction member in-between. Thus, the movable member can be driven by a constant force, even if there is no complete agreement between the direction in which the plate springs are held, and the direction wherein the movable member can move. Further, the drive apparatus of the present invention allows the drive friction member to be directly sandwiched between the plate springs. This arrangement ensures a simple structure and a reduced cost of the drive apparatus.

The drive apparatus of the present invention may further comprises auxiliary springs which are each arranged outside the plate springs; each of the auxiliary springs applying elastic forces to both ends of each of the plate springs.

This structure allows the auxiliary spring to reinforce the force of the plate springs holding the drive friction member in-between on opposite ends of each of the plate springs. This configuration avoids possible reduction in the force of holding the drive friction member in-between on opposite ends due to the bending of the plate springs in the longitudinal direction, and permits a constant drive force to be generated independently of the position of the movable member.

The drive apparatus of the present invention, wherein a tip of a free end of each of the plate springs may be bent outwardly.

This arrangement ensures that the plate spring is not easily bent in the longitudinal direction, and minimizes the possible fluctuation in the force of holding the drive friction member in-between depending on the position of the plate spring. Thus, a constant drive force is generated independently of the position of the movable member.

Effect of the Invention

In the present invention, the drive friction member of the movable member is sandwiched between the pair of plate springs. Even though there is no complete agreement between the moving direction of the movable member and the fixing direction of the plate springs, a constant driving force is generated independently of the position of the movable member. Thus, this arrangement provides a less expensive self-propelled type drive apparatus capable of stable driving.

DESCRIPTION OF THE NUMERALS

Figure 1:
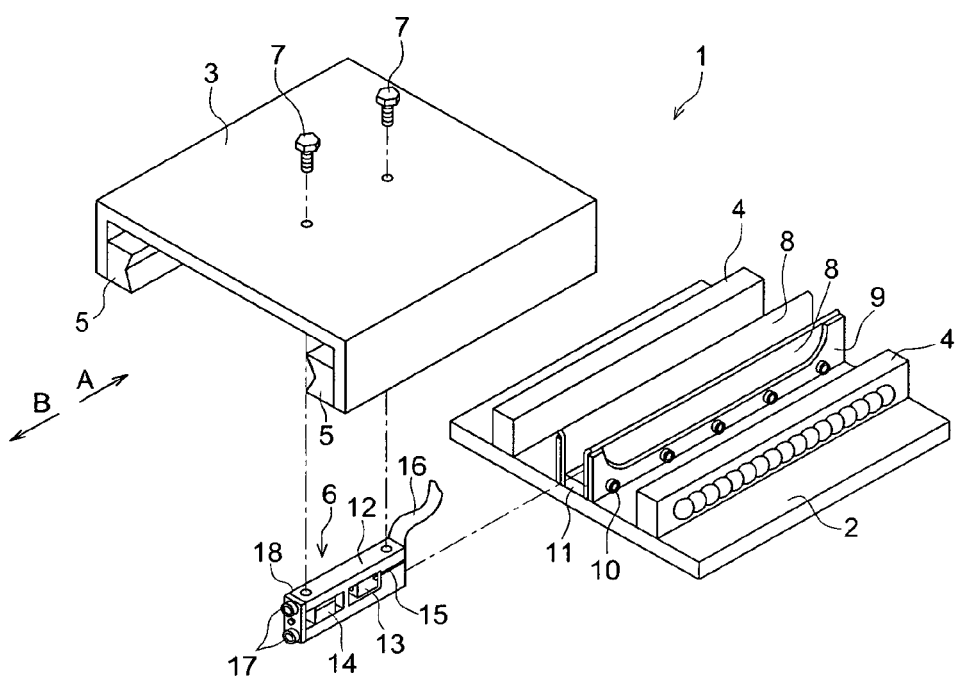
FIG. 1 is a exploded perspective view of a drive apparatus as an embodiment of the present invention.

1. Drive apparatus
8. Main plate spring
9. Auxiliary spring
11. Base member
12. Movable member
13. Piezoelectric element (electromechanical transducer)
14. Drive friction member

BEST MODE FOR CARRYING OUT THE INVENTION

The following describes the embodiments of the present invention with reference to drawings:

FIG. 1 shows the drive apparatus 1 as an embodiment of the present invention. The drive apparatus 1 positions a stage 3 in the direction of arrow A-B on a pedestal 2. The stage 3 contains a sliding block 5 that slidably engages with a guide block 4 mounted on the pedestal 2, and is movable only in the direction of arrow A-B with respect to the pedestal 2.

A movable unit 6 is fixed on the stage 3 by bolts 7. The pedestal 2 is provided with a base member 11 for holding a pair of main plate springs 8 for holding the movable unit 6 in-between and auxiliary springs 9 arranged outside the main plate springs 8, wherein the aforementioned main plate springs 8 and auxiliary springs 9 are pressed each other by screws 10. To put it another way, the movable unit 6 is located between the main plate springs 8 so as to expand the main plate springs 8 and auxiliary springs 9 outwardly, and is sandwiched in-between by the reaction force of the main plate springs 8 and auxiliary springs 9.

Figure 2:
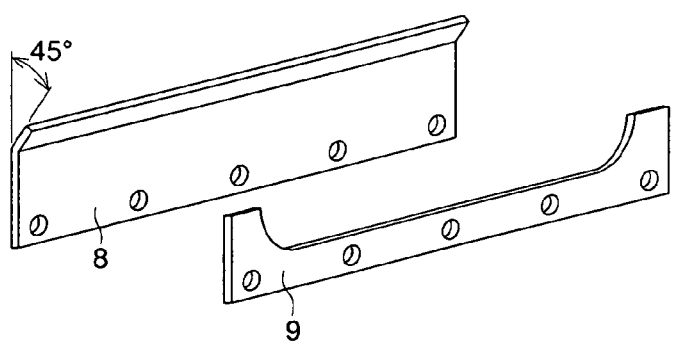
FIG. 2 is a detailed perspective view of a main plate spring and auxiliary spring of FIG. 1.

As shown in FIG. 2, the main plate springs 8 are the plate springs of the present invention and are made up of belt-shaped metallic plate. The lower sides thereof are held by the base member 11 in such a way as to be held in a cantilever manner in the direction of the short sides. In the main plate springs 8, the tips on the upper side which are free ends not held by the base member 11 are bent outwardly by about 45° over the entire length.

The auxiliary springs 9 are held in a cantilever manner by the base member 11 on the outside of the main plate springs 8. The auxiliary springs 9 extends to the vicinity of the top end of the main plate springs 8 in the direction of shorter side only at the portions of the both ends where the auxiliary springs 9 and the main plate springs 8 overlap each other. The center portion hardly protrudes upward from the base member 11.

The base member 11 is fixed onto the pedestal 2 in such a way as to keep the main plate springs 8 in parallel with the direction A-B wherein the stage 3 can move.

Figure 3:
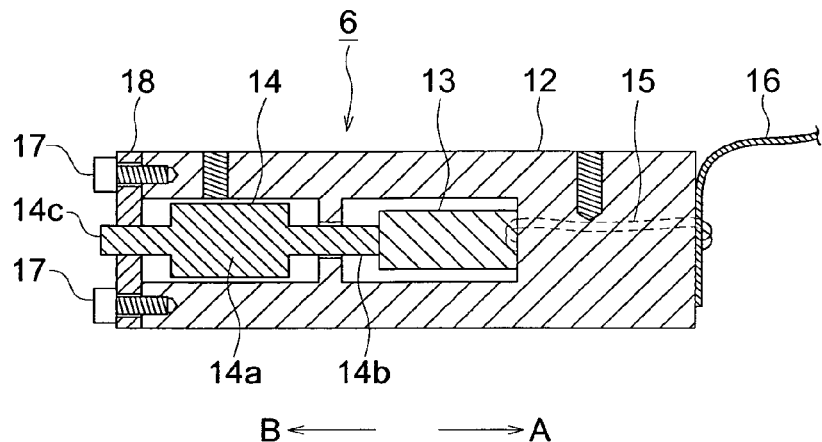
FIG. 3 is a cross sectional view of a movable member of FIG. 1.

As shown in FIG. 3, the movable unit 6 includes a movable member 12 made up of a metallic block of approximately rectangular parallelepiped and a piezoelectric element 13 and drive friction member 14 both contained therein.

The piezoelectric element 13 is an electromechanical transducer of the present invention. Its one end is fixed to the movable member 12. The drive voltage is applied through a lead wire 15 and flexible printed circuit board 16, whereby the piezoelectric element 13 expands and contracts in the same direction A-B as the moving direction of the stage 3.

The drive friction member 14 is formed of a carbon fiber, for example. It includes a friction section 14a protruding sidewardly from the movable member 12 and sandwiched by the main plate springs 8; and shafts 14b and 14c which protrude from the both ends of the friction section 14a in the direction wherein the piezoelectric element 13 expands and contracts, and which are each supported slidably by the movable member 12 and the sealing plate 18 fixed to the end of the movable member 12 with screws 17. One of the shafts 14b of the drive friction member 14 is connected to the other end, of the piezoelectric element 13, opposite to the end fixed to the movable member 12, and the drive friction member 14 is oscillated in the direction A-B (direction of extension and contraction of the piezoelectric element 13) inside the movable member 12 by the extension and contraction of the piezoelectric element 13.

Figure 4:
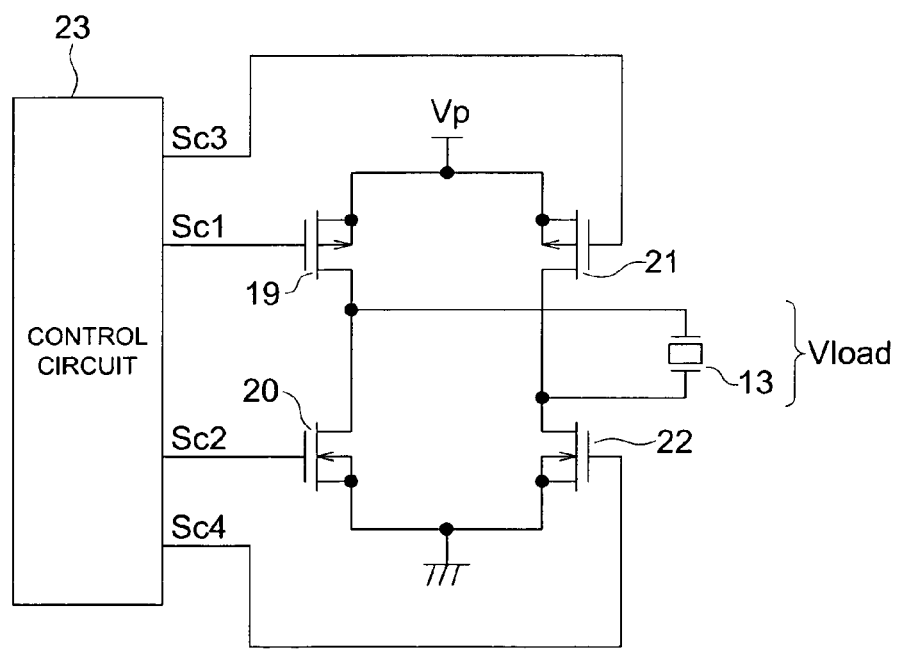
FIG. 4 is a circuit diagram showing a drive circuit to drive the drive apparatus of FIG. 1.

FIG. 4 shows a drive circuit for applying a voltage to the piezoelectric element 13. This drive circuit is made up of a power supply of Vp(V), four FETs 19, 20, 21 and 22, and a control circuit 23 for outputting the control signals Sc1, Sc2, Sc3 and Sc4 for switching the FETs 19, 20, 21 and 22, respectively. The drive circuit can switch a drive voltage Vload applied across the piezoelectric element 13, to any one of the +Vp(V), −Vp(V) and 0(V) by the combination of the control signals Sc1, Sc2, Sc3 and Sc4.

Figure 5:
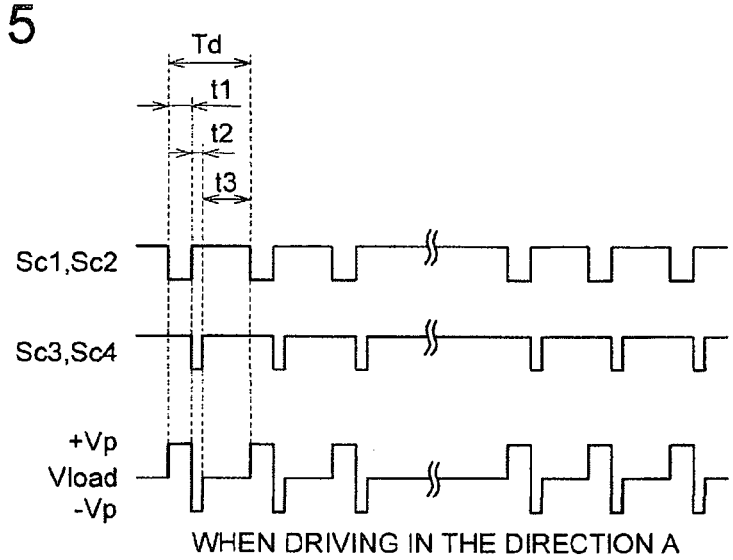
FIG. 5 is a time chart showing the drive voltage signal of the drive circuit of FIG. 4.

In the drive apparatus 1, when the stage 3 is driven in the direction of arrow A, the drive circuit applies the drive voltage Vload of FIG. 5 to the piezoelectric element 13. In FIG. 5, the drive circuit first applies +Vp(v) to the piezoelectric element 13 for a time period t1. Then it applies −Vp(V) for a time period t2. And then it applies 0(V) for a time period t3.

At the time period t1, +Vp(V) is applied so that the piezoelectric element 13 extends from the non-voltage standard length to a maximum length. Then at the time period t2, −Vp(V) is applied so that the piezoelectric element 13 contracts to the minimum length. At the time period t3, the length of the piezoelectric element 13 goes back to the non-voltage standard length. In this case, when the drive voltage Vload increases from 0(V) to Vp(V) or from −Vp(V) to 0(V), the piezoelectric element 13 exhibits a slower extension since the voltage change is smaller. In the meantime, when the drive voltage Vload decreases from +Vp(V) to −Vp(V), the piezoelectric element 13 exhibits a faster contraction since the voltage change is greater.

When the piezoelectric element 13 exhibits a slower extension at the time periods t1 and t3, the movable member 12 moves in the direction of arrow A with respect to the base member 11 since the friction section 14a of the drive friction member 14 is sandwiched between the main plate springs 8. Further, when the piezoelectric element 13 exhibits a faster contraction at the time period t2, the inertial force of the movable member 12 becomes greater than the frictional force between the friction section 14a of the drive friction member 14 and the main plate springs 8. The movable member 12 remains in the current position, and the friction section 14a of the drive friction member 14 is made to slide between the main plate springs 8 in the direction of arrow A. The moving distance of the movable member 12—i.e., the stage 3—at the time period Td as a total of the time periods t1, t2 and t3 is determined by a change in the length of the piezoelectric element 13 and frictional force between the friction section 14a of the drive friction member 14 and the main plate springs 8. Accordingly, assuming the series of these voltage changes within the operation time period Td as one cycle of drive operation, the drive circuit repeats the cycle of drive operation depending on the distance for moving the stage 3.

Figure 6:
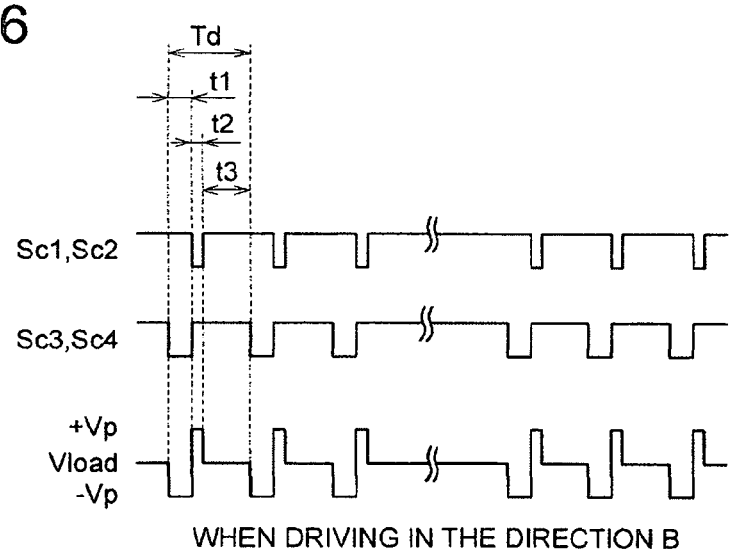
FIG. 6 is a time chart showing the drive voltage signal when traveling in the direction opposite to that in FIG. 5.

In the drive apparatus 1, to move the stage 3 in the direction of arrow B, the output timing of the control signals Sc1 and Sc2 and the output timing of the control signals Sc3 and Sc4 should be made opposite to those when the stage 3 is moved in the direction of arrow A, as shown in FIG. 6. In this case, the extension-contraction waveform of the piezoelectric element 13 is contrary to that of the drive by drive voltage of FIG. 5—i.e., the piezoelectric element 13 exhibits a slower contraction and a faster extension, whereby the movable member 12 is moved in the direction of arrow B with respect to the base member 11. If the frictional force between the drive friction member 14 and main plate springs 8 is constant, the moving distance of the movable member 12 and stage 3 for each drive operation is the same in the opposite direction as that of FIG. 5.

Figure 7:
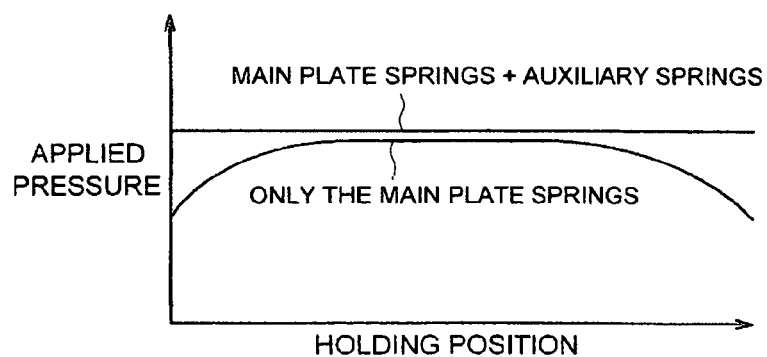
FIG. 7 is a diagram representing the distribution of pressure applied by the main plate spring and auxiliary spring of FIG. 1.

FIG. 7 shows the distribution of a change in the pressure of the main plate springs 8 applied to the drive friction member 14 in the position wherein the drive friction member 14 is sandwiched (holding position), i.e., the distribution of the elastic force of the main plate springs 8 and auxiliary springs 9 in the direction of the long side. The main plate springs 8 are distorted in the direction of short side to apply pressure to the drive friction member 14. They can also be distorted in the direction of long side. Accordingly, in the absence of auxiliary springs 9, only the vicinity of the portion holding the drive friction member 14 is distorted in the direction of short side to apply pressure. To put it another way, when the main plate springs 8 hold the drive friction member 14 at any one of the end portions in the direction of long side, there is a reduction in the portion that can be distorted in the direction of long side. This results in reduction of the effective length of distortion in the direction of short side, whereby pressure is reduced.

In the present embodiment, the tips of the main plate springs 8 in the direction of short side are bent. Thus, the bent portion serves as a rib for suppressing distortion of the main plate springs 8 in the direction of long side, thereby reducing the change in the pressure of the main plate springs 8 depending on the position of the drive friction member 14. However, this cannot avoid the reduction of the pressure on both ends of the main plate springs 8, as shown in FIG. 7.

Thus, in the present embodiment, auxiliary springs 9 are arranged outside the main plate springs 8. Only both sides of the auxiliary springs 9 extend upward in the direction of short side, and elastic force can be applied to the main plate springs 8. To put it another way, the auxiliary springs 9 support the main plate springs 8 only on both ends, and pressure is applied to the drive friction member 14 through the main plate springs 8. Thus, as shown in FIG. 7, the pressure by the main plate springs 8 and auxiliary springs 9 is hardly changed by the position of the drive friction member 14. Thus, the frictional force between the main plate springs 8 and drive friction member 14 is not changed by the position of the movable unit 6. The moving distance of the stage 3 for one cycle of drive operation for the aforementioned time period Td is always kept constant, independently of the position of the movable unit 6.

Both sides of the movable unit 6 are sandwiched by the elastic main plate springs 8. Even if there is a horizontal misalignment in the directions of installing the guide block 4 and base member 11, there is hardly any change in the pressure applied to the drive friction member 14 as long as this misalignment is kept within the range of elastic deformation of the main plate springs 8 in the direction of short side, with the result that the production error is minimized in the drive performance of the drive apparatus 1.

Further, the tips of the main plate springs 8 are bent outward. This arrangement ensures easy insertion of the movable unit 6 between a pair of main plate springs 8 from above, when the main plate springs 8 and auxiliary springs 9 have been fixed to the base member 11. This simplifies the assembling of the drive apparatus 1.

Instead of the auxiliary springs 9 shown in this embodiment, a plate spring having a shorter length in the direction A-B can be arranged on each of both ends of the main plate springs 8 in the direction of long side. It is also possible to use another type of spring having an elastic force only on both ends of the main plate springs 8 in the direction of long side.

Figure 8:
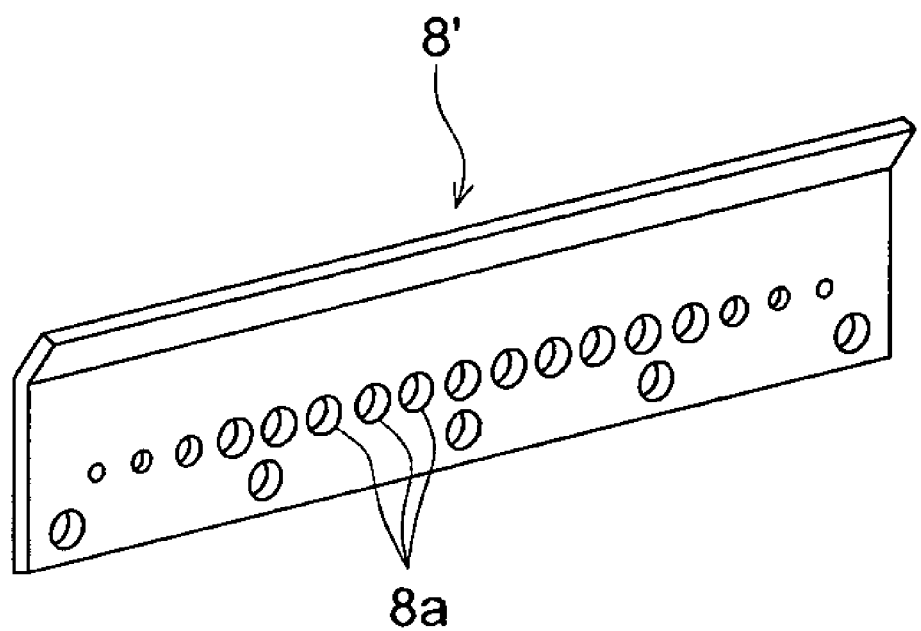
FIG. 8 is a perspective view showing the main plate spring as an alternative to that of FIG. 3.

The pressure applied to the drive friction member 14 can be maintained constant by using a main plate springs 8' of FIG. 8, without using the auxiliary springs 9. The main plate spring 8' has a through-holes 8a for reducing the elastic force at the portion subjected to elastic deformation in such a way that the through-holes 8a at the center is greater in diameter while the through-holes 8a on both sides are smaller.

Further, instead of the through-holes 8a, a plurality of non-through holes or grooves can be formed on the main plate springs 8'. The depth and number can be changed, without changing the size of the holes or grooves. The main plate springs 8' can be formed in such a way that plate thickness is greater on both ends.

The invention claimed is:

1. A drive apparatus, comprising:
a movable member;
an electromechanical transducer which is secured to the movable member at a first end thereof;
a drive friction member which is connected on a second end of the electromechanical transducer and is supported by the movable member movably in an expansion-contraction direction of the electromechanical transducer;
a pair of plate springs which extend to form two walls of a channel-like shape in the expansion-contraction direction of the electromechanical transducer, the walls of the plate springs slidably sandwiching the drive friction member with pressure to permit the movable member to move in the expansion-contraction direction of the electromechanical transducer;
a base member which holds the plate springs in a cantilever manner in a direction of shorter sides of the plate springs and
auxiliary springs, which are each arranged outside the plate springs and apply elastic force to the walls of the plate springs such that the applied elastic force is larger at end portions of the plate springs than at central portions of the plate springs so that the pressure applied by the plate springs against the drive friction member remains constant as the moveable member moves between opposite end portions of the plate springs,
wherein the movable member is movable in the expansion-contraction direction.

2. The drive apparatus of claim 1, wherein a distal free edge of each of the plate springs is bent outwardly so that pressure applied by the plate springs against the drive friction member remains constant as the moveable member moves between opposite end portions of the plate springs.

3. A drive apparatus, comprising:
a movable member;
an electromechanical transducer which is secured to the movable member at a first end thereof;

a drive friction member which is connected on a second end of the electromechanical transducer and is supported by the movable member movably in an expansion-contraction direction of the electromechanical transducer;

a pair of plate springs which extend to form two walls of a channel-like shape in the expansion-contraction direction of the electromechanical transducer, and configured to slidably sandwich the drive friction member with pressure to permit the movable member to move in the expansion-contraction direction of the electromechanical transducer, wherein a distal free edge of each plate spring is bent outwardly so that pressure applied by the plate springs against the drive friction member remains constant as the moveable member moves between opposite end portions of the plate springs.

* * * * *